(12) United States Patent
Kroeninger et al.

(10) Patent No.: US 7,582,513 B2
(45) Date of Patent: Sep. 1, 2009

(54) ELECTRONIC DEVICE AND METHOD FOR PRODUCING ELECTRONIC DEVICES

(75) Inventors: Werner Kroeninger, Regensburg (DE); Franco Mariani, Bad Abbach (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/865,177

(22) Filed: Oct. 1, 2007

(65) Prior Publication Data

US 2008/0224316 A1    Sep. 18, 2008

(30) Foreign Application Priority Data

Oct. 2, 2006    (DE) .................. 10 2006 046 789

(51) Int. Cl.
*H01L 21/00*    (2006.01)
(52) U.S. Cl. ............... 438/114; 438/455; 257/E23.005; 257/E21.506
(58) Field of Classification Search ................. 438/455, 438/458–459, 110, 113
See application file for complete search history.

(56) References Cited

U.S. PATENT DOCUMENTS

| | | | |
|---|---|---|---|
| 5,302,554 A | 4/1994 | Kashiwa et al. | |
| 5,365,092 A * | 11/1994 | Janesick | 257/232 |
| 6,797,544 B2 | 9/2004 | Sakai et al. | |
| 2001/0002051 A1 | 5/2001 | Matsumoto | |
| 2002/0197771 A1 | 12/2002 | Dotta et al. | |
| 2003/0022464 A1 | 1/2003 | Hirano et al. | |
| 2006/0172509 A1* | 8/2006 | Mahle et al. | 438/462 |
| 2007/0004171 A1* | 1/2007 | Arana et al. | 438/455 |
| 2007/0045779 A1* | 3/2007 | Hiatt | 257/621 |

FOREIGN PATENT DOCUMENTS

| | | |
|---|---|---|
| GB | 2221344 | 1/1990 |
| JP | 56094736 | 7/1981 |

* cited by examiner

*Primary Examiner*—N Drew Richards
*Assistant Examiner*—Mamadou Diallo
(74) *Attorney, Agent, or Firm*—Dicke, Billig & Czaja, P.L.L.C.

(57) ABSTRACT

One aspect includes an electronic device including an integrated component with a substrate. An electrically conductive first layer region is arranged at the substrate, wherein the layer thickness of the first layer region is greater than 10 micrometers or greater than 50 micrometers.

16 Claims, 3 Drawing Sheets

ELECTRONIC DEVICE AND METHOD FOR PRODUCING ELECTRONIC DEVICES

CROSS-REFERENCE TO RELATED APPLICATIONS

This Utility Patent Application claims priority to German Patent Application No. DE 10 2006 046 789.2, filed on Oct. 2, 2006, which is incorporated herein by reference.

BACKGROUND

One aspect relates to an electronic device and a method for producing electronic devices. The electronic devices can contain an integrated component in a housing body. The integrated component contains for example just one circuit element or a multiplicity of circuit elements, in semiconductor circuit elements, for example, transistors, diodes, sensors, etc. The devices can be produced at the wafer level, the integrated components being singulated if for example a rear side metallization has been produced for all the components of a wafer.

Requirements with regard to the electrical or thermoelectric properties are made of power components, for example, which serve for example for switching currents of greater than 1 ampere or greater than 10 amperes. The switching voltages are for example greater than 30 volts or even greater than 300 volts. When producing such power components, wafers, for example, are thinned in order to set the breakdown voltage of vertical semiconductor circuit elements by way of the layer thickness of the wafer. However, in a different context, too, workpieces, in semiconductor workpieces, are thinned, for example during the production of SOI substrates (silicon on insulator).

There is a need for a simply constructed device that is simple to produce, in a power device. Moreover, there is a need for a simple method for producing a device. For example, the device is intended to contain a thinned substrate, wherein a reduction of the yield by breakage of the thin workpiece is intended to be avoided, for example, during production.

SUMMARY

One embodiment specifies an electronic device, including an integrated component with a substrate. The device also includes an electrically conductive first layer region arranged at the substrate, wherein the layer thickness of the first layer region is greater than 10 micrometers or greater than 50 micrometers.

Furthermore, one embodiment specifies a method, including connecting a carrier slice to a workpiece slice, thinning the workpiece slice, applying an electrically conductive first layer to the thinned workpiece slice, releasing the carrier slice after applying the first layer, and singulating components by separation, wherein both the workpiece slice and the first layer are severed.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
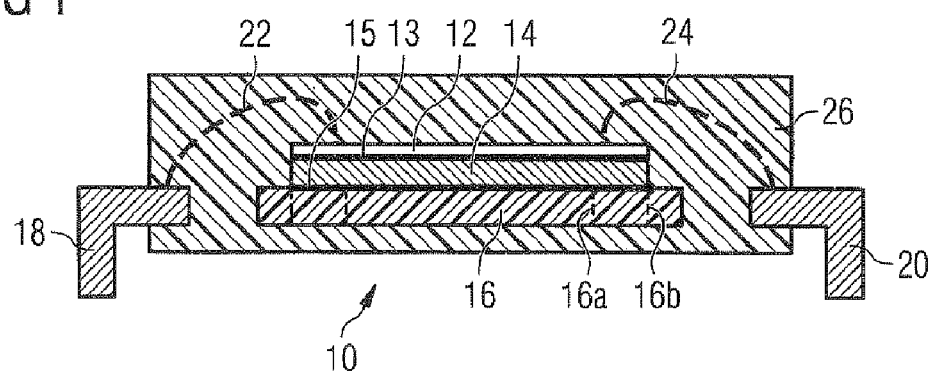
FIG. 1 illustrates an electronic device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The following considerations can be taken as a basis in order to use a so-called embedded carrier or so-called mixed material dicing, that is to say the separation of two or more material layers lying one above another transversely with respect to the stacking direction. Adjacent material layers, have materials which are different from one another, and which therefore have different material properties, such as mechanical properties such as hardness, brittleness, etc. Wafers, such as silicon wafers, can be thinned down to a layer thickness of a few micrometers, for example, to a layer thickness of less than 10 micrometers, or even into the nanometers range, for example down to layer thicknesses of less than 200 nanometers. In this case, a stabilizing carrier which can concomitantly be included in construction can be used, which carrier can be used for example simultaneously as a rear side metal contact. Said carrier can also be referred to as an embedded carrier.

The use of a carrier which can be included in construction can be utilized in, for example, mass production, that is to say for example in daily productions of more than 500 wafers. The wafers can be thinned to layer thicknesses of less than 50 micrometers. In this case, a great effort can be required to apply rear side metallizations to such thin wafers. By way of example, a carrier which is separated from the wafer again could be used for this purpose. However, in the course of removing the wafer provided with a rear side metallization from the carrier and subsequent further processing, for example, testing and inspecting, mechanical damage could then easily occur, such as wafer fracture or edges being knocked off.

A comparably thick rear side metallization can be produced. The metal layer can inherently be used as a carrier. The metal layer can include a sequence of different metal layers. The metal layer or the metal layer sequence can typically be thicker than 10 micrometers or thicker than 30 micrometers or even thicker than 50 micrometers. By way of example, the metal layer or the metal layer sequence can have the following tasks:

balancing or compensating for tensile and/or compressive forces of the overall system comprising active layer or active layers, semiconductor main material and rear side metal, ensuring the stability as carrier, and producing an ohmic contact to the semiconductor material.

Consequently, the rear side contact can simultaneously be embodied as a carrier. The rear side contact can be fixedly connected to the chip or integrated component and can be concomitantly included in construction (embedded carrier).

The rear side metal layer functioning as a carrier can be produced by, for example, sputtering, electrodeposition, deposition without external current (possibly with a material seeding layer that is sputtered, applied by vapour deposition or produced by some other method) or by, for example, thermally laminating on a partial layer, as is also customary during the production of printed circuit boards, for example.

During the application of the rear side metal layer, the wafer or some other workpiece slice can be stabilized by a further carrier system, for example, by a glass plate as in the so-called glass plate method from 3M (Minnesota Mining Manufacturing). The stable composite composed of active layers, bulk silicon and rear side metal carrier can be released from the further carrier or from the auxiliary carrier and be mounted onto a so-called dicing tape and/or dicing frame for singulation, for example.

The singulation of thin workpiece slices, for example, wafers, with rear side metal can have various problems. These problems can be solved by two-stage separation:

1) separation of the semiconductor material, for example, silicon, wherein for example the metal is not severed or is not severed in terms of its entire layer thickness, and
2) separation of the metal or the residual layer thickness of the metal.

By way of example, a so-called progressive cutting can be carried out on a cutting machine or on a plurality of cutting machines using different saw blades optimized for silicon and the respective metal. As an alternative, the singulation can be effected by a laser beam, for example. Combinations between sawing and laser separation can furthermore be used.

The electronic device can include:

An integrated component with a substrate, for example, with a semiconductor substrate, for example a monocrystalline or polycrystalline silicon substrate.

An electrically conductive first layer region arranged at the substrate, wherein the layer region is composed of a homogeneous material or wherein the layer region contains a plurality of partial layers.

The layer thickness of the substrate can be in one of the following relationships with the layer thickness of the first layer region:

a) the layer thickness of the substrate can be less than 50 micrometers and the layer thickness of the first layer region can be greater than 90 micrometers or even greater than 150 micrometers, or
b) the layer thickness of the substrate can lie within the range of 50 micrometers to 100 micrometers and the layer thickness of the first layer region can be greater than 50 micrometers or greater than 100 micrometers, or
c) the layer thickness of the substrate can lie within the range of 100 micrometers to 200 micrometers and the layer thickness of the first substrate region can be greater than 30 micrometers or greater than 90 micrometers.

The layer thickness of the first layer region is for example less than 500 micrometers or even less than 300 micrometers in all the aforementioned variants a) to c). To put it another way, as layer thicknesses of the substrate decrease, the first layer region is intended to afford additional stability by additional layer thickness.

The substrate and the first layer region can have identical contours at an interface between the substrate and the first layer region, as is the case for example if a single separating operation is used for singulating the devices. As an alternative, the contours can deviate from one another along the periphery of the interface only by a distance of at most 20 micrometers or of at most 5 micrometers. This is the case for example if two saw blades having different thicknesses are used for singulating the devices in two separating operations. Since the substrate is, for example, sawn first, the first layer region can protrude further than the substrate. This is attributable for example to the fact that after the first separating operation using a first saw blade, a further separating operation is carried out using a thinner second saw blade in comparison with the first saw blade.

The device can include a housing body, which is arranged at the substrate and at the first layer region. The housing body can contain an epoxy resin or some other polymer material. As an alternative, ceramic housings can also be used. The housing body can serve for protecting the integrated component against environmental influences, such as, for example, moisture, such as for hermetic protection.

The device can additionally include a second layer region arranged at the first layer region. The second layer region can be a part of a so-called leadframe. As an alternative, the second layer region can contain an interposer printed circuit board, a thin-film wiring arrangement or similar wiring arrangements. In all the examples mentioned, the device is then for example also mounted onto a mounting printed circuit board carrying further components arranged in other housing bodies. However, the device can also be mounted directly onto a printed circuit board without a second layer region, for example using flip-chip technology.

The second layer region can be electrically conductive and can include, for example, a homogeneous material or a layer stack. The layer thickness of the electrically conductive second layer region can be greater than 100 micrometers and less than 800 micrometers. On account of the layer thicknesses mentioned, methods from micromechanics can be used for processing the second layer region.

An electrically conductive connecting layer, for example a solder material layer or a diffusion solder material layer, can be arranged between the first layer region and the second layer region. In this case, the solder materials can have a melting point of less than 400° C. Diffusion solder layers can be produced at temperatures of less than 400° C., but after diffusion soldering have a melting point that is greater than 400° C.

The second layer region can be or include a carrier lamina surrounded by connection legs. The carrier lamina and at least one section of each connection leg can be arranged in one plane, as is typical of leadframes. The carrier lamina and the connection legs can be composed of the same material, for example of copper or a copper alloy; said material can also be provided with a protective layer.

As an alternative, the second layer region can be an interposer printed circuit board, in which thin conductive track layers are enclosed by insulating layers, wherein the thickness of a layer can lie for example within the range of 50 to 150 micrometers. The interposer printed circuit board can be surrounded by the housing body on all sides.

Furthermore as an alternative, the second layer region can be a wiring device produced using thin-film technology. Such wiring devices can have layer thicknesses of less than 20 micrometers even if they contain for example more than one metallization layer. The housing body can be arranged only on one side of the wiring device, as is the case if the thin-film wiring device is arranged directly at the housing body only after the production of the housing body. Thin-film technology, for example, is very well suited to wafer level production.

The first layer region can contain a first layer which contains copper or includes copper or a copper alloy having at least 70 atomic percent of copper. For example, the layer thickness of the first layer can be at least 70% of the layer thickness of the first substrate region. Consequently, the first layer is the main layer of the first layer region.

As an alternative, the first layer region can contain a first layer which contains aluminum or includes aluminum or an aluminum alloy having at least 70 atomic percent of aluminum. For example, the layer thickness of the first layer can be at least 70% of the layer thickness of the first layer region, such that the first layer is the main layer of the first layer region.

The abovementioned materials copper and aluminum have a high electrical conductivity and can be processed comparatively simply. For example, copper can be applied at temperatures of less than 150° C. Aluminum, too, can be applied for example at these temperatures by means of cold sputtering methods. As will be explained in greater detail further below, this can be used in the production of the devices.

The device can contain at least one or a multiplicity of high-voltage transistors designed for switching voltages of greater than 30 volts or greater than 300 volts. Examples are DMOS transistors (Double Diffused Metal Oxide Semiconductor) or IGBT elements (Isolated gate Bipolar Transistor). Precisely in the case of these devices, for example the breakdown voltage of a vertical circuit element can be set by means of the thickness of a substrate, wherein the substrate can be thinned during production.

A method is additionally specified, which can include the features of:
  connecting a carrier slice to a workpiece slice; the contours of carrier slice and workpiece slice are identical or the carrier slice is somewhat larger than the workpiece slice, for example circular contours or rectangular or square contours.
  Thinning the workpiece slice, for example by means of a multi-stage thinning with grinding, CMP and wet-chemical etching. A single-stage thinning method is used as an alternative, however.
  Applying an electrically conductive first layer to the thinned workpiece slice. Said layer has, for example, a stabilizing effect on the thinned workpiece slice. Moreover, said layer can be used for a rear side contact. The first layer is a metal layer or a metal layer stack.
  Releasing the carrier slice after applying the first layer. The carrier slice can be reused since it can be detached without being destroyed. After the carrier slice has been released, the first layer undertakes the stabilizing effect.
  Singulating components, such as integrated semiconductor components, by separation, wherein both the workpiece slice and the first layer are severed. The components are then processed further to form devices, such as by being provided with a housing body, wherein the first layer is still present at the workpiece lamina. Consequently, a so-called embedded carrier can be used.

The releasing process can be effected prior to arranging the first layer in a sawing frame. As an alternative, however, the process of releasing the carrier slice is effected after arranging the first layer in a sawing frame. For example the first layer can be adhesively bonded onto a sawing film, such as onto a self-adhesive film.

The layer thickness of the first layer is chosen such that the composite composed of workpiece slice and first layer warps by less than 3000 micrometers or by less than 200 micrometers after releasing the layer region. The above-mentioned values hold true in the case of wafers having a diameter of 150 mm, 200 mm or even of 300 mm or more. The reduced warpage makes it possible to use machines and automatic manufacturing systems, in wafer transport systems, which are also used for standard wafers, that is to say wafers having the customary layer thicknesses of, for example, 750 micrometers or more.

The method can include the feature of:
  singulating integrated devices, wherein workpiece slice and first layer are severed in mutually different separating operations. By way of example, two mutually different saw blades are used, such as one saw blade suitable for semiconductor substrates and another saw blade suitable for metal layers. For example, when sawing metal, care should be taken to ensure that the saw blade does not "seize up", for example, so-called clogging.

As an alternative, the method can include the feature of:
  singulating integrated components, wherein workpiece slice and first layer are severed in a common separating operation, such as using a saw blade or a laser beam. For example, when sawing metal, laser beams around which water circulates are suitable.

The carrier slice can include a semiconductor substrate or be composed of a semiconductor substrate, such as a monocrystalline semiconductor substrate or polycrystalline semiconductor substrates such as are used for example in thin film transistor technology (TFT—Thin Film Transistor) or in solar technology. By way of example, silicon, gallium arsenide or other materials can be used as semiconductor materials.

The method can additionally include the features of:
  after thinning and such as before applying the first layer, introducing dopants into the workpiece slice, such as a so-called rear side doping, and
  activating the dopants by increasing the temperature. In this context, this is also referred to as a drive-in of the dopants.

The temperature of the workpiece slice can be increased successively in different partial regions when activating the dopants; such as, a laser beam can be used. This measure prevents relatively great heating of the workpiece. By way of example, the carrier slice is still fitted to the substrate at this point in time. If for example temperatures of 200° C. or even of 140° C. are not exceeded, the carrier slice can be adhesively bonded with the substrate in a simple manner. Low temperatures during production are also advantageous for a metallization as is possibly already present on the front side of the substrate or for integrated components on the front side of the substrate.

Insofar as the word "can" is used in this description, both the possibility and the actual technical realization are meant. Exemplary embodiments are explained below, but, like the abovementioned embodiments as well, they serve only for elucidation and not for restriction.

FIG. 1 shows an electronic device 10, for example a power device, in particular an IGBT (Isolated Gate Bipolar Transistor). The electronic device 10 contains an integrated component 12, which, for its part, contains a multiplicity of electronic circuit elements or only one such circuit element. As an alternative, the device 10 can also contain a plurality of integrated components, for example a drive circuit and an integrated component with switching elements.

The electronic device 10 additionally contains a rear side metallization 14, which is fixed to the integrated component 12 for example with the aid of a barrier layer 13. Examples of barrier layers are explained in more detail below with reference to FIGS. 3 and 4.

Furthermore, the device 10 contains a carrier lamina 16, which is fixed to the rear side metallization 14 for example with the aid of a fixing layer 15. The carrier lamina 16, the fixing layer 15, the rear side metallization 14, the barrier layer 13 and the integrated component 12 in this order form a layer stack.

In the exemplary embodiment, the integrated component 12, the barrier layer 13 and the rear side metallization 14 have the same lateral dimensions in the cross section illustrated. In other exemplary embodiments, the lateral dimensions in the cross section illustrated deviate from one another just by a few micrometers, for example, by less than 10 micrometers. By contrast, the carrier lamina 16 in the exemplary embodiment projects beyond the rear side metallization 14 by a number of micrometers, for example, by more than 10 micrometers. In other exemplary embodiments, however, the carrier lamina 16a or 16b has a smaller contour than the rear side metallization 14 or, respectively, the same contour as the rear side metallization 14.

The integrated device 10 additionally contains connection legs 18, 20, which have formed a leadframe during production for example with the carrier lamina 16. In the exemplary embodiment, there is a bonding wire 22 between the integrated component 12 and the connection leg 18. There is a bonding wire 24 between the integrated component 12 and the connection leg 20. By way of example, the connection leg 18 serves as connection of a control terminal (gate). By contrast, the connection leg 20 serves, for example, as connection of an operating terminal, for example, drain or source. The device 10 also contains a further connection leg, for example, source or drain, respectively, which is electrically conductively connected to the carrier lamina 16.

In the exemplary embodiment, the electronic device 10 is surrounded by a housing body 26, for example by an epoxide-based housing body.

In other exemplary embodiments, a printed circuit board or a wiring arrangement produced using thin-film technology is used instead of the carrier laminae 16, 16a, 16b. As an alternative, other connection possibilities are utilized. By way of example, the integrated component 12 can be mounted onto an interposer printed circuit board or onto a main printed circuit board using flip-chip technology, that is to say, if appropriate, without the use of bonding wires.

Figure 2A:
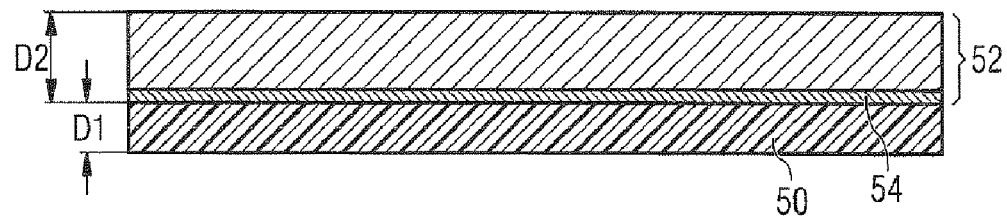
FIGS. 2A to 2E show production stages during the production of the electronic device.

The method steps explained below with reference to FIGS. 2a to 2e are carried out during the production of the device 10. FIG. 2A illustrates that a carrier plate 50 is taken as a starting point, for example a silicon plate, a ceramic plate, a sapphire plate or else a metal plate. The carrier plate 50 has for example a layer thickness D1 within the range of 500 micrometers to 1 mm. The carrier plate 50 is adhesively bonded for example onto a wafer 52, for example using a double-sided adhesive film. However, other fixing methods are also utilized, for example spot solderings.

The wafer 52 contains already integrated circuit elements, such as transistors on or in an active wafer layer 54. Said wafer layer 54 faces the carrier plate 50. By way of example, the active wafer layer 54 is protected by an imide layer. Such a layer can also serve for topology equalization.

In the exemplary embodiment, the wafer 52 is a silicon wafer. The layer thickness D2 of the wafer is for example greater than 400 micrometers, for example 750 micrometers.

In an alternative method, the carrier plate 50 is a glass plate and the so-called glass plate method from the company 3M is used. The wafer is areally connected to the glass plate, which is possibly somewhat larger than the wafer, by means of an adhesion substance, for example, an adhesive. Possible topologies of the active wafer are embedded in the process. After the process steps that are carried out with the carrier, the adhesive connection can be separated again. In this case, an auxiliary layer previously applied to the carrier is activated with the aid of a laser. The carrier can then be removed. The adhesive layer is subsequently removed from the active wafer with the aid of a self-adhesive film.

Figure 2B:
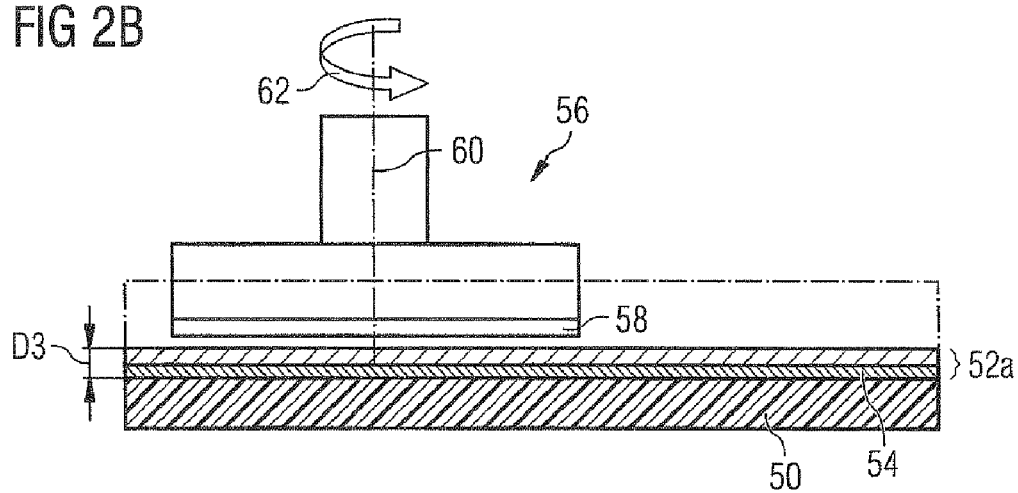

As is illustrated in FIG. 2B, the wafer 52 is subsequently thinned from its rear side, that is to say from the side at which no circuit elements are integrated. In this case, a thinned wafer 52a having a layer thickness D3 is produced from the wafer 52. The layer thickness D3 is as constant as possible over the entire wafer 52a and, in the exemplary embodiment, lies, for example, within the range of 5 micrometers to 10 micrometers, for example only a tolerance of at most 1 or 2 micrometers occurring over the entire wafer diameter.

By way of example, a three-stage thinning process is used for thinning the wafer. By way of example, the wafer is firstly thinned by means of a grinding method (not illustrated). After the grinding operation, a wet-chemical etching process is carried out, for example, in which the wafer is thinned to the vicinity of the thickness D3. Afterwards, a chemical mechanical polishing (CMP) is carried out by means of the polishing head 56 illustrated in FIG. 2B. Situated on the polishing head 56 is an abrasive body 58, which rotates about an axis 60 of rotation, see arrow 62. A polishing slurry (not illustrated) is additionally used.

Before the rear side metallization 14a is applied, for example, a doping step is additionally carried out, for example an implantation step, in order to introduce dopants into the rear side of the wafer 52a. In order to activate the dopants, the wafer 52a is heated in regions with the aid of a laser beam. This measure prevents the adhesive for adhesively bonding the carrier plate 50 onto the wafer 52a from losing its adhesive strength.

Figure 2C:
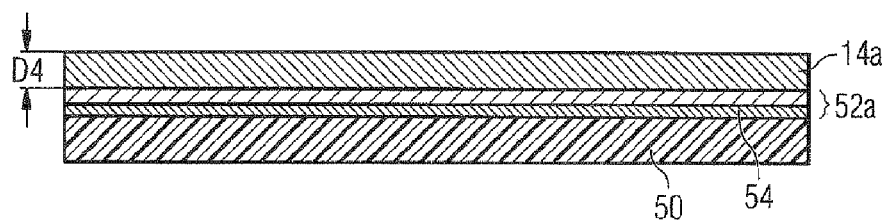

After thinning, as illustrated in FIG. 2C, a rear side metallization layer 14a is produced at the thinned wafer layer 52a with the carrier plate 50 still being present. The methods performed in this case are for example electrodeposition, deposition without external current, sputtering, thermal lamination or further methods. The rear side metallization 14a has a layer thickness D4 of 100 micrometers, for example, in the exemplary embodiment. Barrier layers and optional protective layers are not illustrated in FIG. 2C but are explained in more detail below with reference to FIGS. 3 and 4.

Figure 2D:
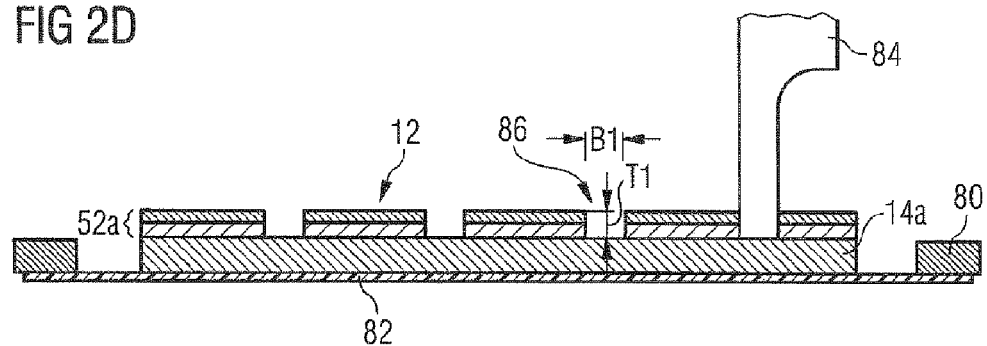

As is illustrated in FIG. 2D, the composite composed of carrier plate 50, thinned wafer 52a and rear side metallization 14a is subsequently adhesively bonded onto a sawing film 82, for example a self-adhesive film. The sawing film 82 is held, for example, in a sawing frame 80. The composite is adhesively bonded onto the sawing film 82, for example, by the uncovered side of the rear side metallization 14a.

The carrier 50 is subsequently removed, for example by using a solvent, by UV irradiation or by being pulled off. In an alternative variant, the carrier 50 is removed before the composite is fixed onto an adhesive film or on a further carrier. In these cases, the carrier 50 can be stripped away for example by increasing the temperature to greater than 100° C., but less than 200° C. As an alternative or in addition, it is possible in turn to use a solvent, a UV radiation or some other method for stripping away the carrier 50. Moreover, further processing steps without the use of intermediate carriers, for example, heat treatment of the wafers, test and inspection of the chips at the wafer level, can be carried out after the removal of the carrier plate 50 and prior to singulation.

As is further illustrated in FIG. 2D, a two-stage separating operation is used in the exemplary embodiment. In a first stage of the separating operation, firstly the wafer 52a is severed with the aid of a comparatively wide saw blade 84. This gives rise for example to a sawing slot 86 having a width of 40 micrometers, for example, and a depth of, for example, the layer thickness D3, that is to say of 10 micrometers, for example. The rear side metallization 14a can already be slightly incipiently sawn during the first stage of the separating operation. As an alternative, however, the rear side metallization 14a is not yet incipiently sawn since, by way of example, the wafer layer 52a has also not yet been completely severed.

Figure 2E:
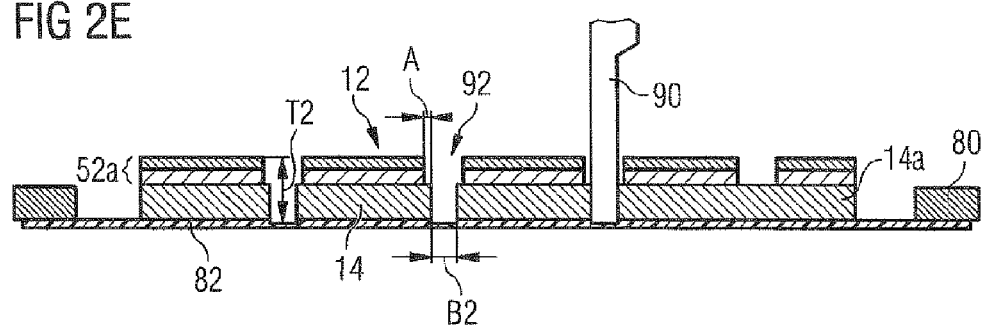

As is further illustrated in FIG. 2E, the second stage of the separating operation is subsequently performed using a saw blade 90, sawing being effected in the sawing slots 86 that were produced in the first stage. A saw blade 90 is, for example, somewhat narrower than the saw blade 84 and produces a deepened sawing slot 92, for example, the lower region of which has a width B2 of 30 micrometers. Consequently, a step arises by virtue of a distance A lying between the lateral surface produced by the first saw blade 84 and the lateral surface produced by the second saw blade 90. The depth T2 of the sawing slot 92 is for example greater than the layer thickness of the composite composed of wafer 52a and rear side metallization 14a. The two-stage singulation gives rise in to the integrated component 12 with the rear side metal 14, also see FIG. 1.

In an alternative separating method, a laser beam is used for the separation. By way of example, a water-cooled laser beam can be used, the water rinsing away metal detachments or swarf, such that a clean separating cut arises. An associated system is offered for example by the company Synova.

In an alternative separating operation, only one saw blade is used, which severs the entire composite.

Figure 3:
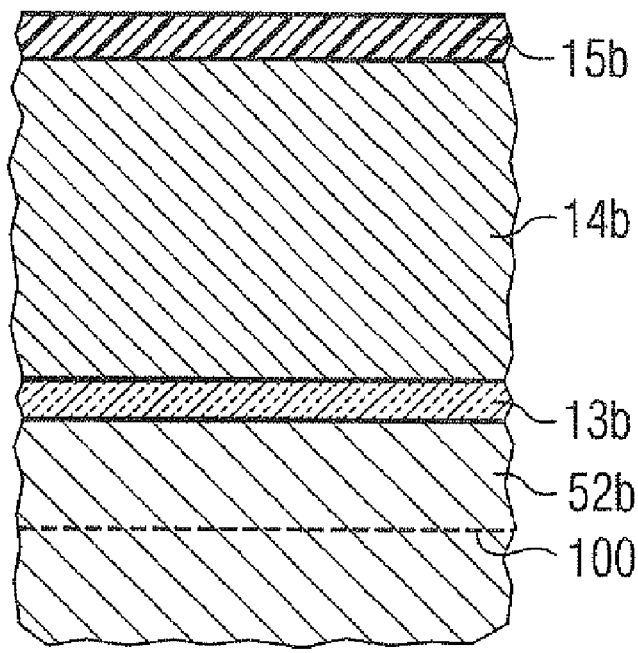
FIG. 3 shows a first exemplary embodiment of a rear side metallization of the device.

FIG. 3 illustrates an exemplary embodiment of a copper-based rear side metallization. A thinned semiconductor wafer 52b corresponds to the semiconductor wafer 52a. FIG. 3 additionally illustrates a doping 100, which has been introduced through the rear side of the wafer 52b in the manner explained above. A barrier layer was deposited on the rear side of the wafer 52b, said barrier layer preventing diffusion of copper into the wafer 52b. By way of example, the layer thickness of the barrier layer 13b is 5 nanometers to 100 nanometers. Suitable materials for the barrier layer 13b are, for example, tantalum or tantalum nitride, such as a double layer composed of said materials or other materials.

A copper layer 14b having a layer thickness within the range of 20 micrometers to 200 micrometers was subsequently applied. In this case, the thickness of the copper layer 14b is chosen depending on the residual layer thickness of the thinned wafer 52b, such that a sufficient stability is present after the carrier plate 50 has been stripped away. In the exemplary embodiment firstly a thin copper seeding layer was sputtered onto the barrier 13b. The copper layer was subsequently produced with the aid of an electrolytic method. A copper alloy layer can also be used instead of a copper layer 14b.

A protective layer 15b or a protective layer stack was subsequently applied to the copper layer 14b. By way of example, a nickel layer and a gold layer were applied in an electroless deposition method. As an alternative, a layer stack composed of nickel, palladium, gold can be applied. Other protective layers are likewise possible. If work is carried out under a protective gas atmosphere or in vacuo, then it is also not necessary to use a protective layer 15b.

The protective layers 15b mentioned ensure a good bondability, for example for aluminum wires, copper wires or gold wires.

As an alternative, the copper layer 14b can also be laminated on, for example onto the barrier layer 13b or directly onto the silicon 52b.

The layer thickness of the thinned wafer 52b lies for example within the range of 100 nanometers to 200 micrometers, or within the range of 1 micrometer to 200 micrometers. For example, wafers having diameters of 150 mm, 200 mm or even 300 mm are used. Depending on the thickness of the thinned wafer 52b, the layer thicknesses mentioned in Patent claim 3 are chosen for the copper layer 14b. It holds true, for example, that the thinner the wafer 52b, the thicker the copper layer 14b is chosen in order to ensure sufficient stability.

Figure 4:
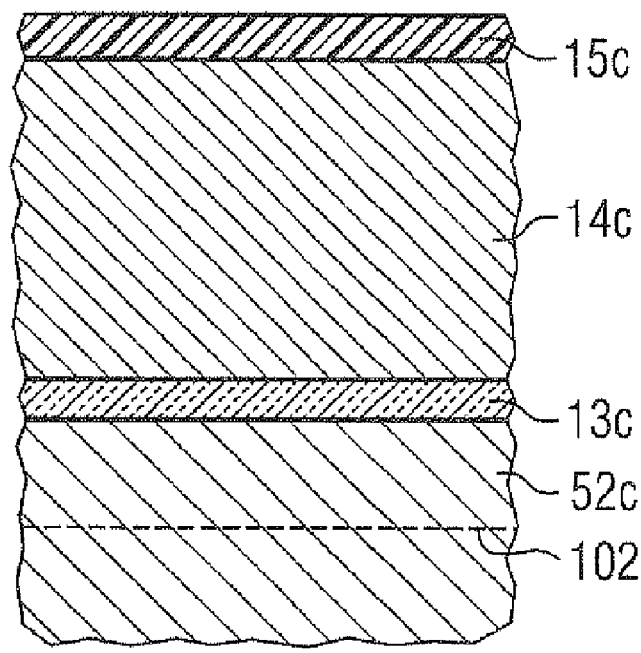
FIG. 4 shows a second exemplary embodiment of a rear side metallization of the device.

FIG. 4 illustrates a further exemplary embodiment of a rear side metallization produced by the method explained with reference to FIGS. 2A to 2E. A thinned wafer 52c corresponds to the wafer 52a, such that reference is made to the explanations above. FIG. 4 illustrates a doping 102, which has been introduced into the rear side of the wafer 52c in accordance with the method explained above. In the exemplary embodiment, the wafer 52c is composed of silicon.

A barrier layer 13c is applied to the rear side of the wafer 52c with the carrier plate 50 still being present. The barrier layer 13c is intended to prevent diffusion of aluminum into the silicon. By way of example, the barrier layer 13c has a layer thickness within the range of 5 nanometers to 100 nanometers. By way of example, titanium or titanium nitride or a similar material is suitable as material of the barrier layer 13c.

After the production of the barrier layer 13c, an aluminum layer 14c was applied to the barrier layer 13c, for example with the aid of a "cold" sputtering method, the wafer 52c being heated to temperatures of less than 100° C. (degrees Celsius), for example, by using an additional cooling or by other suitable measures.

After the production of the aluminum layer 14c, a protective layer 15c composed of aluminum oxide forms automatically for example under air, said protective layer having for example a layer thickness of 5 to 20 nanometers. As an alternative, other protective layers 15c composed of other materials are applied, or work is carried out under a protective gas atmosphere or in vacuo.

Instead of aluminum, an aluminum alloy is also used, for example, which contains at least 75 atomic percent of aluminum, for example.

The layer thickness of the thinned wafer 52c once again lies within the range of, for example, 100 nanometers to 200 micrometers or within the range of 1 micrometer to 200 micrometers, for example, wafers having a diameter of 150 mm, 200 mm or 300 mm once again being used. The layer thickness of the aluminum layer 14c is chosen depending on the layer thickness of the wafer 52c, the values mentioned in Patent claim 3 being applicable. It holds true, for example, that the thinner the wafer layer 52c, the thicker the aluminum layer 14c in order to ensure sufficient stability.

In other exemplary embodiments, bonding is effected onto the protective layer 15b or onto the protective layer 15c or other connecting methods are used for electrical connection, for example, soldered-on wire clips or the like.

Consequently, to summarize it holds true that a rear side metallization can be used as a carrier and that the rear side metallization used as a carrier can also be concomitantly incorporated in a housing body, for example. The technical effects mentioned above result.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for producing an electronic device comprising:
   connecting a carrier slice to a workpiece slice;
   thinning the workpiece slice;
   applying an electrically conductive first layer to the thinned workpiece slice;
   releasing the carrier slice after applying the first layer and, using the first layer as a carrier; and
   singulating components by separation, wherein both the workpiece slice and the first layer are severed and the first layer is used as a contact for the workpiece slice.

2. The method of claim 1 further comprising arranging the first layer in a sawing frame on a sawing film before or after releasing the carrier slice.

3. The method of claim 1, wherein the layer thickness of the first layer is chosen such that the composite composed of workpiece slice and first layer warps by less than 3000 micrometers after releasing the carrier layer, and given a lateral extent of the composite of greater than or equal to 150 millimeters.

4. The method of claim 1, wherein the layer thickness of the first layer region is greater than 10 micrometers.

5. The method of claim 1 further comprising singulating components, wherein the workpiece slice and the first layer are severed in mutually different separating operations using mutually different saw blades.

6. The method of claim 1 further comprising singulating components, wherein the workpiece slice and the first layer are severed in a common separating operation using a saw blade or a laser beam around which water circulates.

7. The method of claim 1, wherein applying the first metal layer comprises:
   applying a layer composed of copper or a copper alloy having at least 70 atomic percent of copper or a layer composed of aluminum or an aluminum alloy having at least 70 atomic percent of aluminum,
   wherein the temperature of the workpiece slice is preferably kept less than 200° C.

8. The method of claim 1, wherein the workpiece slice comprises a monocrystalline semiconductor substrate or a polycrystalline semiconductor substrate.

9. The method of claim 1, comprising:
   introducing dopants into the workpiece slice after thinning; and
   activating the dopants by increasing the temperature;
   wherein during the activating process, the temperature of the workpiece slice is increased successively in different partial regions using a laser beam.

10. The method of claim 1, wherein the layer thickness of the first layer is chosen such that the composite composed of workpiece slice and first layer warps by less than 1000 micrometers after releasing the carrier layer, and given a lateral extent of the composite of greater than or equal to 200 millimeters.

11. The method of claim 1, wherein the layer thickness of the first layer is chosen such that the composite composed of workpiece slice and first layer warps by less than 200 micrometers after releasing the carrier layer, and given a lateral extent of the composite of greater than or equal to 300 millimeters.

12. The method of claim 1, wherein the layer thickness of the substrate is less than 50 micrometers and the layer thickness of the first layer region is greater than 10 micrometers.

13. The method of claim 1, wherein the layer thickness of the substrate lies within the range of 50 micrometers to 100 micrometers and the layer thickness of the first layer region is greater than 10 micrometers.

14. The method of claim 1, wherein the layer thickness of the substrate lies within the range of 100 micrometers to 200 micrometers and the layer thickness of the first layer region is greater than 10 micrometers.

15. The method of claim 1, wherein thinning the workpiece slice comprises thinning the workpiece slice such that its thickness is one third or less than the thickness of the first layer region.

16. A method comprising:
   singulating components, wherein a workpiece slice and a first layer arranged at the workpiece slice are severed in mutually different separating operations, and wherein the workpiece slice is thinned such that its thickness is one third or less than the thickness of the first layer.

* * * * *